(12) United States Patent
Kawamoto et al.

(10) Patent No.: US 10,485,140 B2
(45) Date of Patent: Nov. 19, 2019

(54) AIR DISTRIBUTION UNITS FOR TELECOMMUNICATION EQUIPMENT

(71) Applicant: CenturyLink Intellectual Property LLC, Denver, CO (US)

(72) Inventors: Pete A. Kawamoto, Littleton, CO (US); Diana L. Unser, Lakewood, CO (US); Christopher M. Wills, Littleton, CO (US)

(73) Assignee: CenturyLink Intellectual Property LLC, Broomfield, CO (US)

( * ) Notice: Subject to any disclaimer, the term of this patent is extended or adjusted under 35 U.S.C. 154(b) by 52 days.

(21) Appl. No.: 15/434,584

(22) Filed: Feb. 16, 2017

(65) Prior Publication Data

US 2017/0164524 A1    Jun. 8, 2017

Related U.S. Application Data

(63) Continuation of application No. 14/187,991, filed on Feb. 24, 2014, now Pat. No. 9,609,788.
(Continued)

(51) Int. Cl.
*H05K 7/20* (2006.01)
*H05K 7/18* (2006.01)
*H05K 7/14* (2006.01)

(52) U.S. Cl.
CPC ......... *H05K 7/20745* (2013.01); *H05K 7/186* (2013.01); *H05K 7/20572* (2013.01); *H05K 7/20736* (2013.01); *H05K 7/1488* (2013.01)

(58) Field of Classification Search
CPC .......... H05K 7/20745; H05K 7/20736; H05K 7/20127
(Continued)

(56) References Cited

U.S. PATENT DOCUMENTS

| 7,083,051 B2 | 8/2006 | Smith | |
| 7,595,985 B2 * | 9/2009 | Adducci | H05K 7/186 165/122 |

(Continued)

OTHER PUBLICATIONS

U.S. Appl. No. 14/187,991; Non-Final Rejection dated Jun. 6, 2016; 16 pages.
(Continued)

*Primary Examiner* — Steven B McAllister
*Assistant Examiner* — Ko-Wei Lin

(57) ABSTRACT

Novel tools and techniques are provided for providing in-lineup passive air distribution system designs, and for delivering more effective cooling for termination dense network equipment with high heat dissipation. In some embodiments, one or more air distribution units might be positioned in-line with one or more heat generating equipment. The one or more air distribution units might receive air from an HVAC system, and might distribute the received air to the one or more heat generating equipment. In some cases, the one or more air distribution units might distribute the received air to a position in front of and/or behind the one or more heat generating equipment for intake by an air intake device of at least one of the one or more heat generating equipment. Some air distribution units might comprise dowels for storing fiber slack. Some dowels might comprise an air shaft for distributing the received air.

21 Claims, 11 Drawing Sheets

Related U.S. Application Data

(60) Provisional application No. 61/842,730, filed on Jul. 3, 2013.

(58) Field of Classification Search
USPC .......................... 454/184; 361/827, 688–692
See application file for complete search history.

(56) References Cited

U.S. PATENT DOCUMENTS

| | | | |
|---|---|---|---|
| 7,643,291 B2* | 1/2010 | Mallia | G06F 1/20 361/695 |
| 7,752,858 B2 | 7/2010 | Johnson | |
| 9,609,788 B2 | 3/2017 | Kawamoto et al. | |
| 2005/0153649 A1* | 7/2005 | Bettridge | F24F 9/00 454/188 |
| 2008/0188173 A1* | 8/2008 | Chen | F24F 11/77 454/239 |
| 2008/0318514 A1* | 12/2008 | Fettkether | F24F 13/0218 454/330 |
| 2009/0237880 A1 | 9/2009 | Levesque | |
| 2009/0305625 A1* | 12/2009 | Dawson | H05K 7/20745 454/184 |
| 2011/0239683 A1* | 10/2011 | Czamara | H05K 7/20745 62/259.4 |
| 2012/0003918 A1* | 1/2012 | McReynolds | F24F 13/1426 454/313 |
| 2012/0063083 A1* | 3/2012 | Chang | G06F 1/20 361/679.47 |
| 2013/0149954 A1* | 6/2013 | North | H05K 5/0213 454/184 |
| 2015/0011150 A1 | 1/2015 | Kawamoto et al. | |

OTHER PUBLICATIONS

U.S. Appl. No. 14/187,991; Notice of Allowance dated Nov. 17, 2016; 20 pages.

* cited by examiner

AIR DISTRIBUTION UNITS FOR TELECOMMUNICATION EQUIPMENT

CROSS-REFERENCES TO RELATED APPLICATIONS

This application is a continuation application of U.S. patent application Ser. No. 14/187,991 filed on Feb. 24, 2014 by Pete A. Kawamoto et al., entitled, "Air Distribution Units for Telecommunication Equipment," which claims priority to U.S. Patent Application Ser. No. 61/842,730 (the "'730 application"), filed Jul. 3, 2013 by Pete A. Kawamoto et al., entitled, "Air Distribution Units for Telecommunication Equipment," the entire disclosures of which are incorporated herein by reference in its entirety for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to air distribution and more particularly, to air distribution systems used in cooling heat-generating equipment.

BACKGROUND

New network equipment designs have higher termination density, faster transmission speeds and increasing heat dissipation needs. Integration of cooling units into equipment lineups enable the successful deployment of high heat dissipating equipment in facilities where the existing cooling and air delivery systems are insufficient. Placement of cooling units in lineups, where they are needed to support various types of network equipment, eliminates hot spots in the facilities and reduces heat related network outages, while maximizing ductwork placement and minimizing capital expense investment.

One solution to these issues is active cooling systems, which might include a fan, a compressor, and/or the like. Such systems are expensive to install and maintain, however, and they do not take advantage of existing cooling infrastructure. Another possible solution is passive cooling, in which cooled air from a central system is distributed as needed from diffusers located above the overhead ironwork and cable racking arrangement, and attempting to deliver cold air through the obstructions to cool the heat producing equipment. Existing passive diffusers, however, are not well suited to telecommunications or data center environments. Such solutions tend to be fairly low volume and generally are designed to minimize noise, rather than maximize air distribution. Further, such units generally are not dimensioned properly to integrate well into a telecommunications or data center environment.

Thus, there is a need for more robust air distribution systems.

BRIEF SUMMARY

Various embodiments provide in-lineup passive air distribution system designs that can deliver more effective cooling for termination dense network equipment with high heat dissipation. In one aspect, of certain embodiments, each unit can be capable of delivering supply air cooling near floor level to cool individual or multiple frames or cabinets with total heat loads exceeding 1500 Watts of heat dissipation. In other aspects, some embodiments can supply air to cool even higher amounts of equipment heat dissipation while avoiding the overhead ironwork and cable racking.

Various embodiments can include a single-function air distribution unit ("SADU"), a dual-function air distribution unit ("DADU"), and a multi-function air distribution unit ("MADU"). Each of these embodiments can include units that are self-supporting, are anchored to the floor front and/or rear, and/or provide a direct attachment to the facility air distribution ductwork to provide cooling where it is most needed.

In some embodiments, a SADU can provide air distribution, while a DADU and a MADU can provide air distribution as well as other functions. For example, a DADU and/or a MADU can include apparatus to facilitate routing of optical fiber or other cables between frames. In addition to these features, a DADU and/or a MADU can save on additional material expense by incorporating fiber slack storage and copper cabling space. Another key feature of the MADU is the idea that the fiber slack storage dowels can also be used as air delivery nozzles.

In an aspect, a method might comprise receiving air, with an air distribution unit that is positioned in-line with one or more heat generating equipment, from a heating, ventilation, and air conditioning ("HVAC") system. The method might further comprise distributing, with the air distribution unit, the received air to a position in front of the one or more heat generating equipment for intake by a first air intake device of at least one of the one or more heat generating equipment. The HVAC system, in some instances, might be configured to provide heating, ventilation, and air conditioning to at least a portion of a building in which the one or more heat generating equipment is located.

In some embodiments, the air distribution unit is a passive air distribution unit, while in other embodiments, the air distribution unit might be a dynamic air distribution unit (i.e., might comprise mechanisms including, but not limited to, fans, impellers, air pumps, and/or the like for actively distributing air). According to some embodiments, distributing, with the air distribution unit, the received air to the position in front of the one or more heat generating equipment might comprise redirecting, with the air distribution unit, the received air at a rate of at least 500 cubic feet per minute ("CFM") (and, in some cases, exceeding 1500 CFM or higher) to the position in front of the one or more heat generating equipment.

In some cases, the method might further comprise distributing, with the air distribution unit, the received air to a position to a rear portion of the one or more heat generating equipment for intake by a second air intake device of the at least one of the one or more heat generating equipment.

According to some embodiments, each of at least one of the one or more heat generating equipment might comprise one or more telecommunications equipment, a telecommunications rack, and a rack cooling device. The telecommunications rack might contain the one or more telecommunications equipment, while the rack cooling device might be in communication with the first air intake device. The rack cooling device might be configured to distribute air within the telecommunications rack to cool the one or more telecommunications equipment.

In another aspect, an air distribution unit might comprise an enclosure, an air supply portion, and a plurality of air vents. The enclosure might be positioned in-line with one or more heat generating equipment. The air supply portion might be configured to receive air from a duct termination point of a heating, ventilation, and air conditioning ("HVAC") system. In some instances, the plurality of air vents might be configured to distribute the received air to a position in front of the one or more heat generating equipment for intake by an air intake device of each of the one or more heat generating equipment. According to some embodiments, each of the plurality of air vents might comprise an adjustable louvered directional vent register. In some cases, the adjustable louvered directional vent register might comprise a motorized adjustable louvered directional vent register. According to some embodiments, the air distribution unit might further comprise a flexible connector assembly, which might, in some cases, be configured to provide flexible connection between the air supply portion and the duct termination point of the HVAC system.

In some embodiments, the air distribution unit might further comprise a plurality of dowels attached to one or more of a front surface or a rear surface of the air distribution unit. Each of the plurality of dowels might comprise a shaft and a dowel end plate. The plurality of dowels might be configured to store fiber slack from one or more cables (including, without limitation, optical fiber cables, copper cables, twisted wire data cables, and/or the like) from at least one of the one or more heat generating equipment, by wrapping the fiber slack from the one or more cables around at least a portion of the shaft of at least one dowel of the plurality of dowels. In some instances, each of one or more dowels of the plurality of dowels might comprise an air passage through the shaft and through the dowel end plate. The air passage might direct air from the HVAC system through the enclosure of the air distribution unit to a position in front of the air distribution unit. According to some embodiments, the dowel end plate of at least one dowel of the one or more dowels might comprise a louvered vent opening configured to direct air from the HVAC system through the enclosure of the air distribution unit through the shaft of the at least one dowel to the position in front of the one or more heat generating equipment.

In some instances, the air distribution unit might further comprise one or more cable troughs affixed to one or more of a front surface or a rear surface of the air distribution unit. The one or more cable troughs might be configured to enable cable routing (including, without limitation, optical fiber cable routing, copper cable routing, twisted pair data cable routing, and/or the like) across the air distribution unit (e.g., for multi-equipment system distribution cabling and/or the like). The air distribution unit might also comprise a plurality of anchor points configured to enable floor mounting of the air distribution unit and a plurality of guard rail covers configured to cover the plurality of anchor points.

In yet another aspect, a system might comprise one or more heat generating equipment arranged inline within a row in a room, a heating, ventilation, and air conditioning ("HVAC") system for supplying one or more of heating, ventilation, or air conditioning to the room, and one or more air distribution units. Each of the one or more heat generating equipment might comprise an air intake device, while the HVAC system might comprise a plurality of duct termination points. Each air distribution unit might comprise an enclosure, an air supply portion, and a plurality of air vents. The enclosure might be positioned in-line with the one or more heat generating equipment within the row, while the air supply portion might be configured to receive air from a first duct termination point of the plurality of duct termination points of the HVAC system. The plurality of air vents might be configured to distribute the received air to a position in front of the one or more heat generating equipment for intake by the air intake device of each of the one or more heat generating equipment. According to some embodiments, each of the one or more air distribution units might further comprise a flexible connector assembly, which might, in some cases, be configured to provide flexible connection between the air supply portion and the first duct termination point of the HVAC system.

In some embodiments, at least one of the one or more heat generating equipment might further comprise one or more telecommunications equipment, a telecommunications rack, and a rack cooling device. The telecommunications rack might contain the one or more telecommunications equipment, while the rack cooling device might be in communication with the first air intake device. The rack cooling device might be configured to distribute air within the telecommunications rack to cool the one or more telecommunications equipment. According to some embodiments, each of the plurality of air vents of at least one air distribution unit of the one or more air distribution units might comprise an adjustable louvered directional vent register. In some cases, the adjustable louvered directional vent register might comprise a motorized adjustable louvered directional vent register.

In some embodiments, at least one air distribution unit of the one or more air distribution units might further comprise a plurality of dowels attached to one or more of a front surface or a rear surface of the at least one air distribution unit. Each of the plurality of dowels might comprise a shaft and a dowel end plate. The plurality of dowels might be configured to store fiber slack from one or more cables (including, without limitation, optical fiber cables, copper cables, twisted wire data cables, and/or the like) from at least one of the one or more heat generating equipment, by wrapping the fiber slack from the one or more cables around at least a portion of the shaft of at least one dowel of the plurality of dowels. In some instances, each of one or more dowels of the plurality of dowels might comprise an air passage through the shaft and through the dowel end plate. The air passage might direct air from the HVAC system through the enclosure of the at least one air distribution unit to a position in front of the at least one air distribution unit. According to some embodiments, the dowel end plate of at least one dowel of the one or more dowels might comprise a louvered vent opening configured to direct air from the HVAC system through the enclosure of the at least one air distribution unit through the shaft of the at least one dowel to the position in front of the one or more heat generating equipment.

Various modifications and additions can be made to the embodiments discussed without departing from the scope of the invention. For example, while the embodiments described above refer to particular features, the scope of this invention also includes embodiments having different combination of features and embodiments that do not include all of the above described features.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF CERTAIN EMBODIMENTS

Figure 1A:
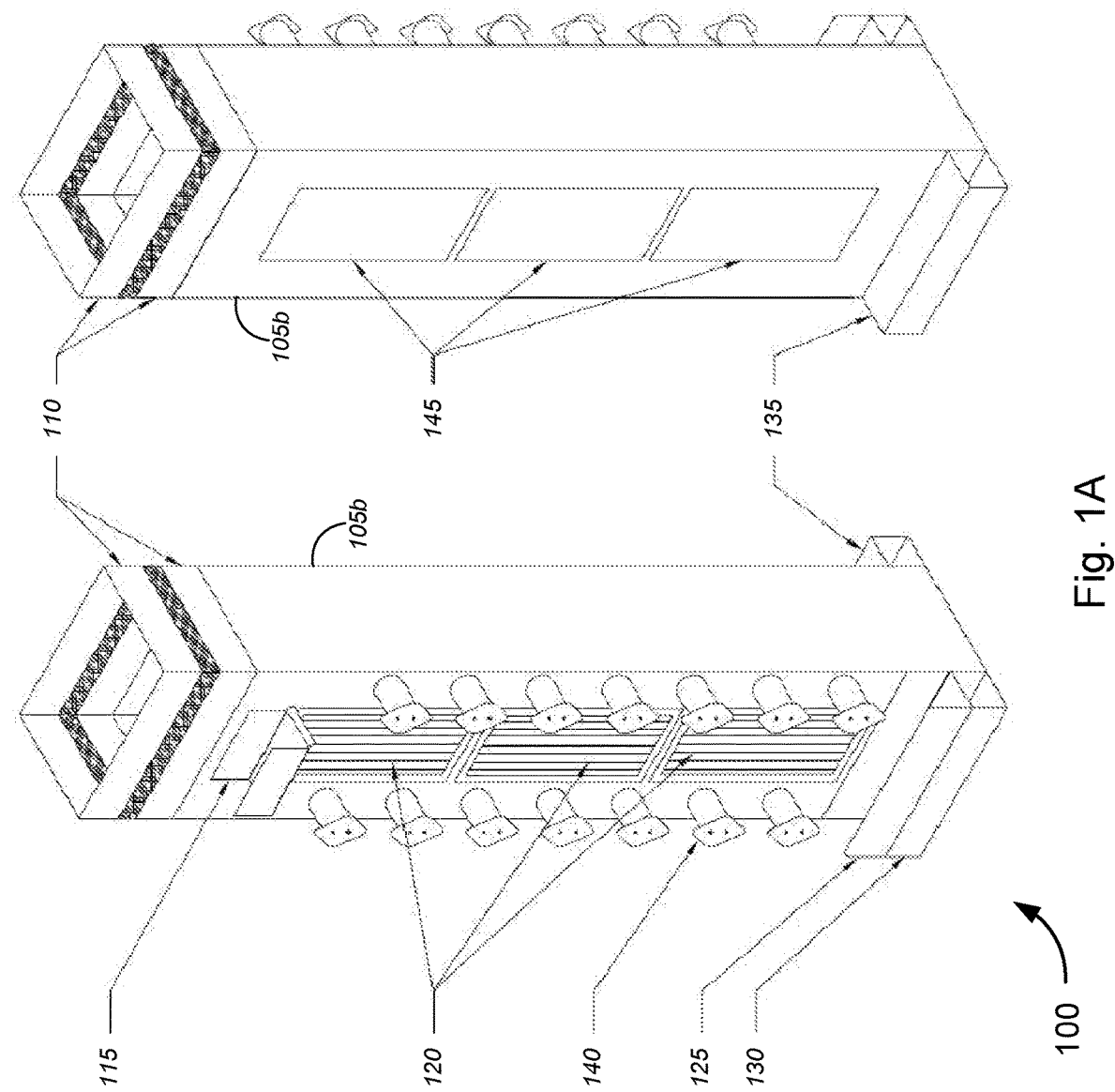
FIGS. 1A-1D are general schematic diagrams illustrating various air distribution units, in accordance with various embodiments.

While various aspects and features of certain embodiments have been summarized above, the following detailed description illustrates a few exemplary embodiments in further detail to enable one of skill in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art, however, that other embodiments of the present invention may be practiced without some of these specific details. In other instances, certain structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Various embodiments provide in-lineup passive air distribution system designs that can deliver more effective cooling for termination dense network equipment with high heat dissipation. In one aspect, of certain embodiments, each unit can be capable of delivering supply air cooling near floor level to cool individual or multiple frames or cabinets with total heat loads exceeding 1500 Watts of heat dissipation, and in some cases exceeding 4000 Watts of heat dissipation, while in other cases exceeding 18,000 Watts of heat dissipation. In other aspects, some embodiments can supply air to cool even higher amounts of equipment heat dissipation while avoiding the overhead ironwork and cable racking. Although specific heat dissipation values are mentioned above, such heat dissipation values are merely illustrative, and the various embodiments are not limited to such levels of heat dissipation. Rather, the in-lineup passive air distribution system, described herein, may be scaled to any suitable level to address any heat dissipation levels achievable by any arrangement of termination dense network equipment, by any similar heat generating (non-network) equipment, and/or the like.

Various embodiments can include a single-function air distribution unit ("SADU"), a dual-function air distribution unit ("DADU"), and a multi-function air distribution unit ("MADU"). Each of these embodiments can include units that are self-supporting, are anchored to the floor at the front and/or rear of each unit, and/or provide a direct attachment to the facility air distribution ductwork (e.g., facility heating, ventilation, and air conditioning ("HVAC") system) to provide cooling where it is most needed.

In some embodiments, a SADU can provide air distribution, while a DADU and a MADU can provide air distribution as well as other functions. For example, a DADU and/or a MADU can include apparatus to facilitate routing of optical fiber or other cables between frames. In addition to these features, a DADU and/or a MADU can save on additional material expense by incorporating fiber slack storage and copper cabling space. Another key feature of the MADU is the idea that the fiber slack storage dowels can also be used as air delivery nozzles.

Certain embodiments can provide the ability to deliver cooling near floor level next to equipment frames/cabinets, thereby eliminating chassis carding restrictions due to high heat dissipation limits, facility cooling delivery constraints resulting from misplaced overhead diffusers, and/or conflicts with overhead cable rack/ironwork obstructions in network equipment environments. Distribution units can be employed in a variety of environments, frames, and/or cabinets, including, in particular, telecommunication central offices ("COs"), data centers/Cybercenters™, and/or the like. In some embodiments, the units may be sized to fit between telecommunications frames, and units can be placed on either side of a frame to provide additional cooling.

Different embodiments can provide several benefits. For example, some embodiments can take advantage of existing network and real estate infrastructure (including, specifically, cooling infrastructure). The flexible design of some embodiments enables concentration and placement of cooling where and when needed, and/or can provide a flexible, direct connection to existing overhead heating, ventilation, and air conditioning ("HVAC") system ductwork. In some cases, embodiments can allow the elimination of standard CO cabinets equipped with top fan assemblies for high heat equipment. Through the use of certain embodiments, providers can achieve maximum card deployment within a chassis, with no limitations due to heat dissipation requirements. Such passive cooling units introduce no chilled water or refrigerant near electrical equipment, mitigating risk to reliability, and multiple vents allow for redirection and control of cooling and airflow.

The sizing of some embodiments is designed to integrate into standard CO and data center environments. For example, some embodiments are sized for new 7 foot (about 213 cm) through 11.5 foot (about 351 cm) overhead ironwork environments, and a particular embodiment might be sized at about 7 feet (height)×20 inches (width)×23 inches (depth) [i.e., about 213 cm (height)×51 cm (width)×58 cm (depth)]. In other embodiments, base footprint/size can minimize equipment lineup space impact. In an aspect, in-line placement of the units helps spread frame floor loading for heavy equipment frames.

We now turn to the embodiments as illustrated by the drawings. FIGS. 1-5 illustrate some of the features of the method for providing in-lineup passive air distribution system designs, and the method, system, and/or apparatus for delivering more effective cooling for termination dense equipment (including, without limitation, network equipment) with high heat dissipation, as referred to above. The methods, systems, and apparatuses illustrated by FIGS. 1-5 refer to examples of different embodiments that include various components and steps, which can be considered alternatives or which can be used in conjunction with one another in the various embodiments. The description of the illustrated methods, systems, and apparatuses shown in FIGS. 1-5 is provided for purposes of illustration and should not be considered to limit the scope of the different embodiments. Further, the various components of the figures are merely illustrative and are not intended to be to scale.

Figure 1B:
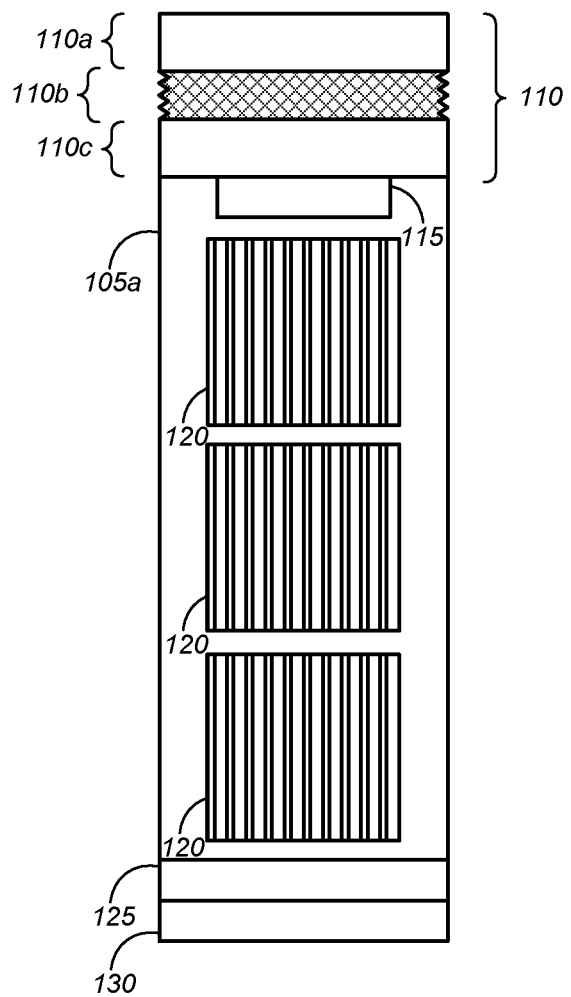
Figure 1C:
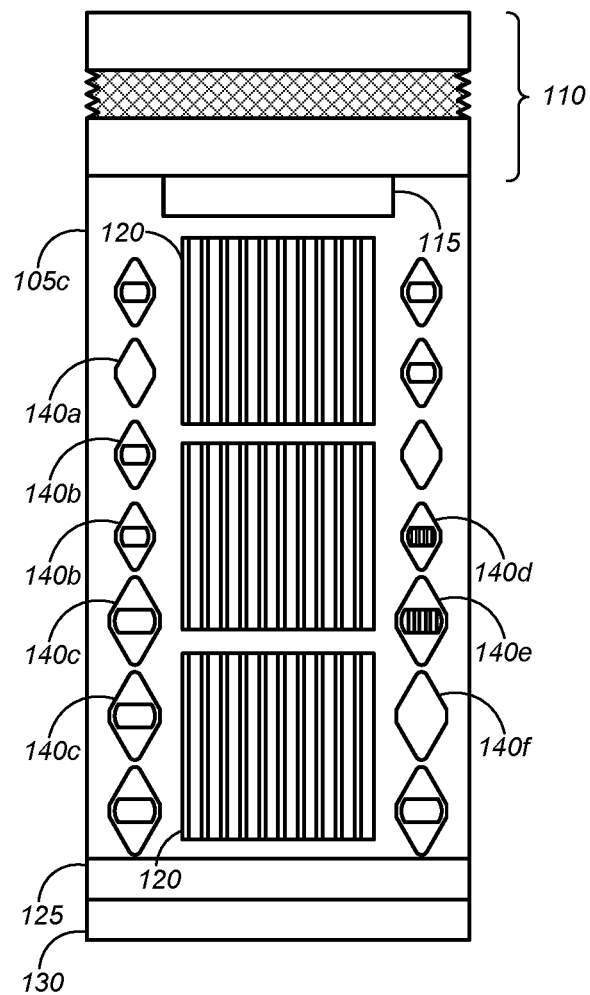
Figure 1D:
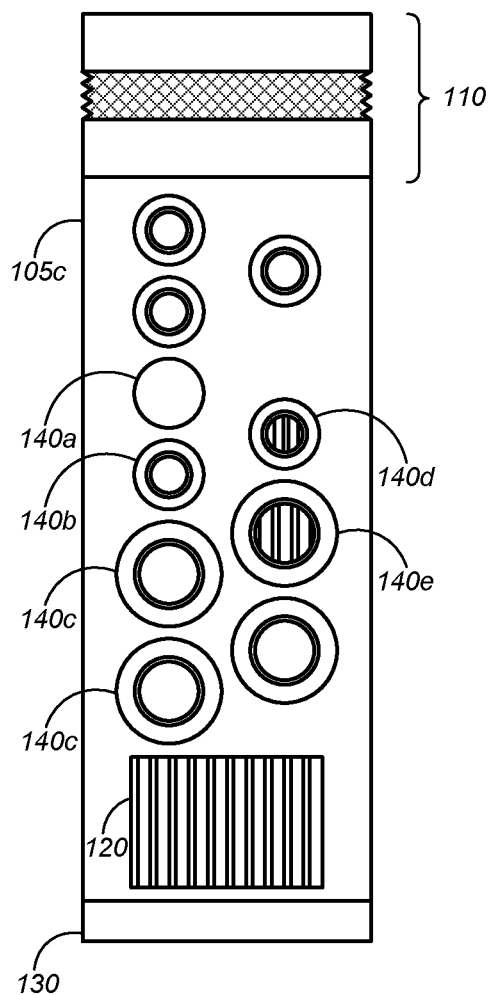

With reference to the figures, FIGS. 1A-1D (collectively, "FIG. 1") are general schematic diagrams illustrating various air distribution units 100, in accordance with various embodiments. FIG. 1A shows one embodiment of a dual-function air distribution unit ("DADU"), while FIG. 1B shows one embodiment of a single-function air distribution unit ("SADU"). FIGS. 1C and 1D show two different embodiments of a multi-function air distribution unit ("MADU").

In FIG. 1, air distribution unit 100 might comprise enclosure 105, flexible connector assembly 110, upper cable trough 115, one or more air vents 120, lower cable trough 125, front guard rail cover 130, and/or rear guard rail cover 135. In some cases, the enclosure 105 might be a passive air distribution conduit, which, in some instances, might be sized and/or shaped to fit in-line within a row of heat generating equipment (including, without limitation, telecommunications equipment, telecommunications equipment racks, data center equipment, data center equipment racks, and/or the like).

According to some embodiments, flexible connector assembly 110 might be configured to directly couple an air supply portion (e.g., a top opening shown in FIG. 1A) of the air distribution unit 100 with a duct termination point of an HVAC system (which typically includes ceiling conduits and downward facing duct termination points extending from portions of the ceiling ducts/conduits). Herein, a "duct termination point" (which might otherwise be referred to as a "duct connection point" or a "duct branch") might refer to a point at which air from the HVAC system leaves the HVAC system. In the case of air leaving the HVAC system and entering an uncontrolled (or otherwise open) space, the duct connection point might comprise a supply vent of the HVAC system. In the case of air leaving the HVAC system and entering a controlled space (e.g., entering an air distribution unit, as described herein), the duct termination point might comprise a duct connection point, which connects the HVAC system to the controlled space (in this example, an air distribution unit). The flexible connector assembly 110 serves to provide vibration isolation between the overhead ducts of the HVAC system and the air distribution unit 100. As shown in FIGS. 1B-1D, flexible connector assembly 110 might comprise an upper connector portion 110a, a flexible portion 110b, and a lower connector portion 110c. The flexible portion 110b might be made of any suitable material (including rubber, plastic, and/or the like) that allows for flexible yet resilient/durable connection between the air distribution unit 100 and the duct termination point of the HVAC system, while isolating any vibration between the air distribution unit 100 and the duct termination point or ducts/conduits of the HVAC system (e.g., as shown in FIGS. 2 and 3).

In some instances, the one or more air vents 120 might be mounted on a front surface of the air distribution unit 100 (and, in some cases, a rear surface as well) to direct or distribute air received from the HVAC system to a position in front of (and/or behind) the air distribution unit 100 (i.e., at floor level). In some embodiments, the one or more air vents 120 might comprise non-directional vent registers and louvered directional vent registers, which can be static louvered directional vent registers, adjustable louvered directional vent registers, or motorized adjustable louvered directional vent registers. The louvered directional vent registers allow air to be directed to the front and side of the air distribution unit 100. For example, as shown in FIGS. 3 and 4 (as described below), air received from the HVAC system can be redirected or distributed by the air distribution unit to a position in front of (and/or behind) one or more adjacent (or nearby) heat generating equipment for intake by an air intake device of each of the one or more adjacent (or nearby) heat generating equipment.

The upper cable trough 115 and the lower cable trough 125 might be configured to enable cable routing (including, without limitation, optical fiber cable routing, copper cable routing, twisted pair data cable routing, and/or the like) across the air distribution unit 100 (e.g., for multi-equipment system distribution cabling and/or the like). Although FIG. 1 shows the upper and lower cable troughs 115 and 125 affixed to the front surface of the air distribution unit 100, one or both troughs 115 and 125 may be additionally and/or alternatively affixed to the rear surface of the air distribution unit 100. Further, although FIG. 1 shows the upper cable trough 115 having a width less than a width of the air distribution unit 100, and shows the lower cable trough 125 having a width that is substantially the same as the width of the air distribution unit 100, any suitable width of either cable trough may be implemented, so long as each is able to support one or more cables routing across the air distribution unit 100. The air distribution unit 100 might also comprise a plurality of anchor points (not shown) configured to enable floor mounting of the air distribution unit 100. In some instances, at least four anchor points (i.e., at the front and rear, near either side surface of the air distribution unit 100) may be used to anchor the air distribution unit 100 to the floor of the room of the facility. The front guard rail cover 130, and/or rear guard rail cover 135 are configured to cover the plurality of anchor points.

In some embodiments, air distribution unit 100 might further comprise a plurality of dowels 140. The plurality of dowels 140 might each comprise a shaft and a dowel end plate. The plurality of dowels 140 might be configured (or might otherwise be shaped and sized) to store fiber slack from one or more cables (including, without limitation, optical fiber cables, copper cables, twisted wire data cables, and/or the like) from at least one of the one or more heat generating equipment, by wrapping the fiber slack from the one or more cables around at least a portion of the shaft of at least one dowel of the plurality of dowels. The dowel end plate might be any suitable shape including, but not limited to a diamond (as shown in FIG. 1C), a circle (as shown in FIG. 1D), square (not shown), rectangle (not shown), and/or the like. In some cases, corners of the dowel end plates (such as, but not limited to, the diamond shaped dowel end plates shown in FIG. 1C) may be rounded to prevent injury to workers and/or damage to cables (especially fragile optical cables), and/or the like. The dowel end plates might be made of any suitable material including, but not limited to, metal, plastic, and/or the like. The shaft might be made of the same or different material from the dowel end plates, and can be of any suitable material including, without limitation, metal, plastic, and/or the like.

The plurality of dowels 140 might comprise any combination of one or more basic dowels 140a, one or more air distributing dowels 140b, one or more enlarged air distributing dowels 140c, one or more louvered vent dowels 140d, one or more enlarged louvered vent dowels 140e, and/or one or more enlarged basic dowels 140f, and/or the like. The one or more air distributing dowels 140b and the one or more enlarged air distributing dowels 140c might each comprise an air passage through the shaft and through the dowel end plate, and the air passage directs air from the HVAC system through the enclosure 105 of the air distribution unit 100 to a position in front of the at least one air distribution unit 100. The one or more louvered vent dowels 140d and the one or more enlarged louvered vent dowels 104e might each comprise a dowel end plate having a louvered vent opening configured to direct air from the HVAC system through the enclosure 105 of the air distribution unit 100 through the shaft of the dowel to a position in front of the at least one air distribution unit 100 and/or to a position in front of the one or more heat generating equipment. The louvered vent opening can be any of non-adjustable louvered directional vent openings, adjustable louvered directional vent openings, and/or motorized adjustable louvered directional vent openings, as appropriate.

In some embodiments, the air distribution unit 100 might further comprise one or more rear cover plates 145, which allow for possible relocation or addition of one or more air vents (e.g., air vents 120 as described above) to provide rear heat mitigation (e.g., as shown in FIG. 4 with respect to rows 420d and 420e).

A SADU as described above, and as shown in FIG. 1B, might comprise enclosure 105a, flexible connector assembly 110, and one or more air vents 120, without any dowels 140. In this manner, the single function of the SADU is to distribute air to neighboring heat generating equipment. In some instances, the SADU might include any combination of upper cable trough 115, lower cable trough 125, front guard rail cover 130, rear guard rail cover 135, and/or the one or more rear cover plates 145.

A DADU as described above, and as shown in FIG. 1A, might comprise enclosure 105b, flexible connector assembly 110, one or more air vents 120, and a plurality of dowels 140a and/or 140f, without any air distribution dowels 140b-140e (i.e., dowels comprising air passages for directing air through the dowels). In this manner, the double functions of the DADU are to distribute air to neighboring heat generating equipment and to store/organize cable slack. In some instances, the DADU might include any combination of upper cable trough 115, lower cable trough 125, front guard rail cover 130, rear guard rail cover 135, and/or the one or more rear cover plates 145.

A MADU as described above, and as shown in FIGS. 1C and 1D, might comprise enclosure 105c, flexible connector assembly 110, one or more air vents 120, and a plurality of dowels 140, including any combination of dowels 140a-140f. In this manner, the multiple functions of the MADU are to distribute air to neighboring heat generating equipment, to store/organize cable slack, and to distribute air through at least some of the dowels. In some instances, the MADU might include any combination of upper cable trough 115, lower cable trough 125, front guard rail cover 130, rear guard rail cover 135, and/or the one or more rear cover plates 145.

Figure 2A:
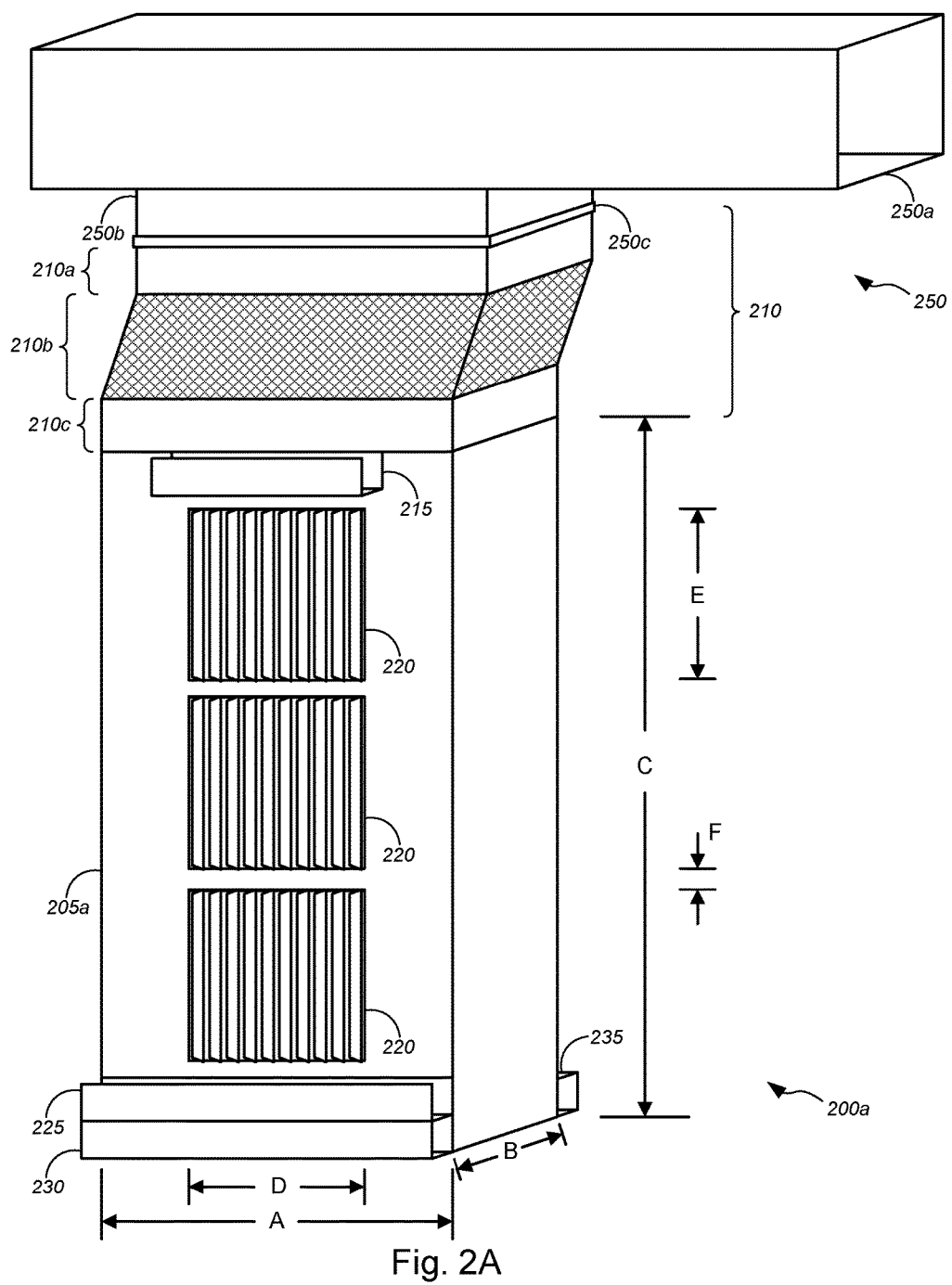
FIGS. 2A-2C are general schematic diagrams illustrating various air distribution units coupled to corresponding HVAC systems, in accordance with various embodiments.
Figure 2B:
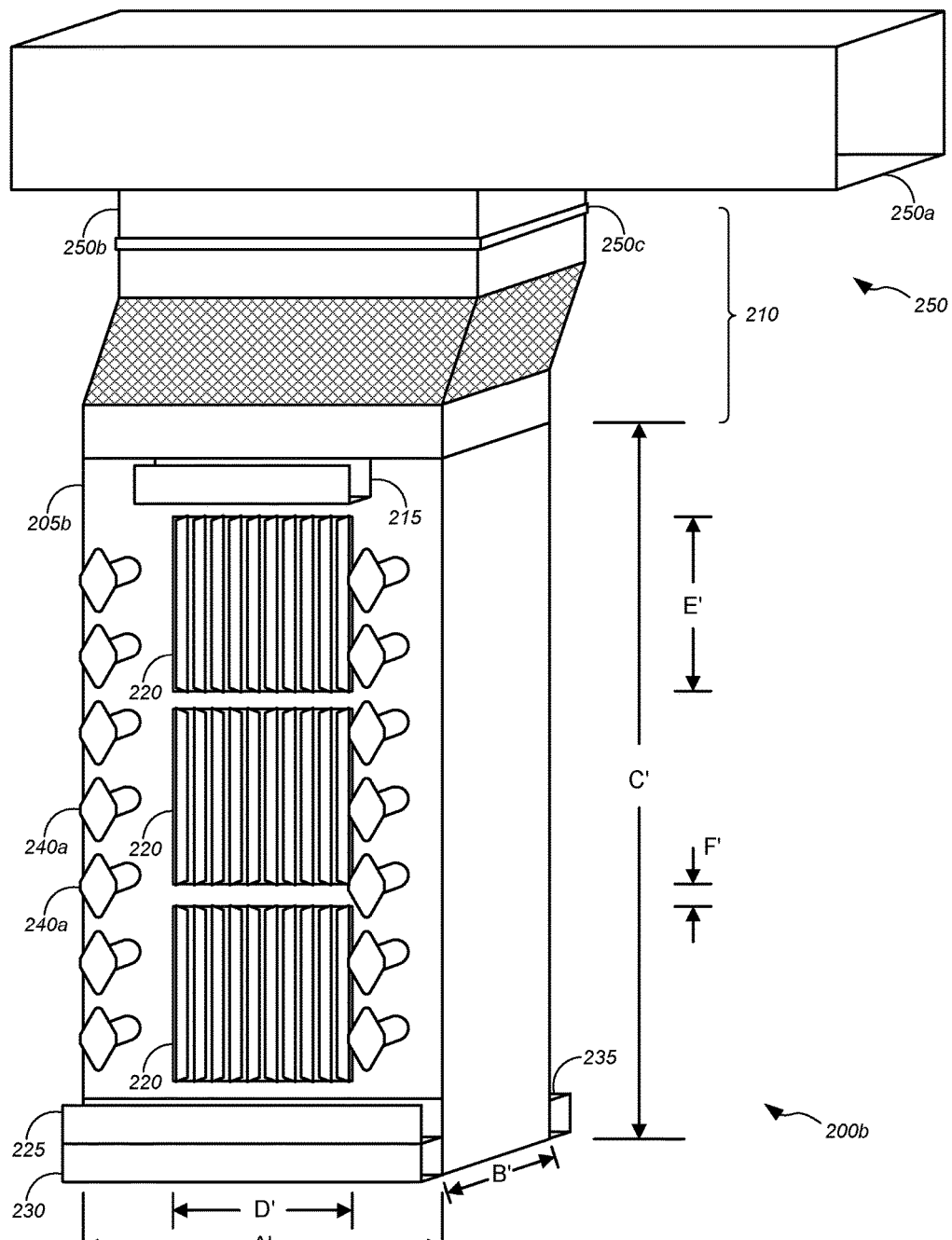
Figure 2C:
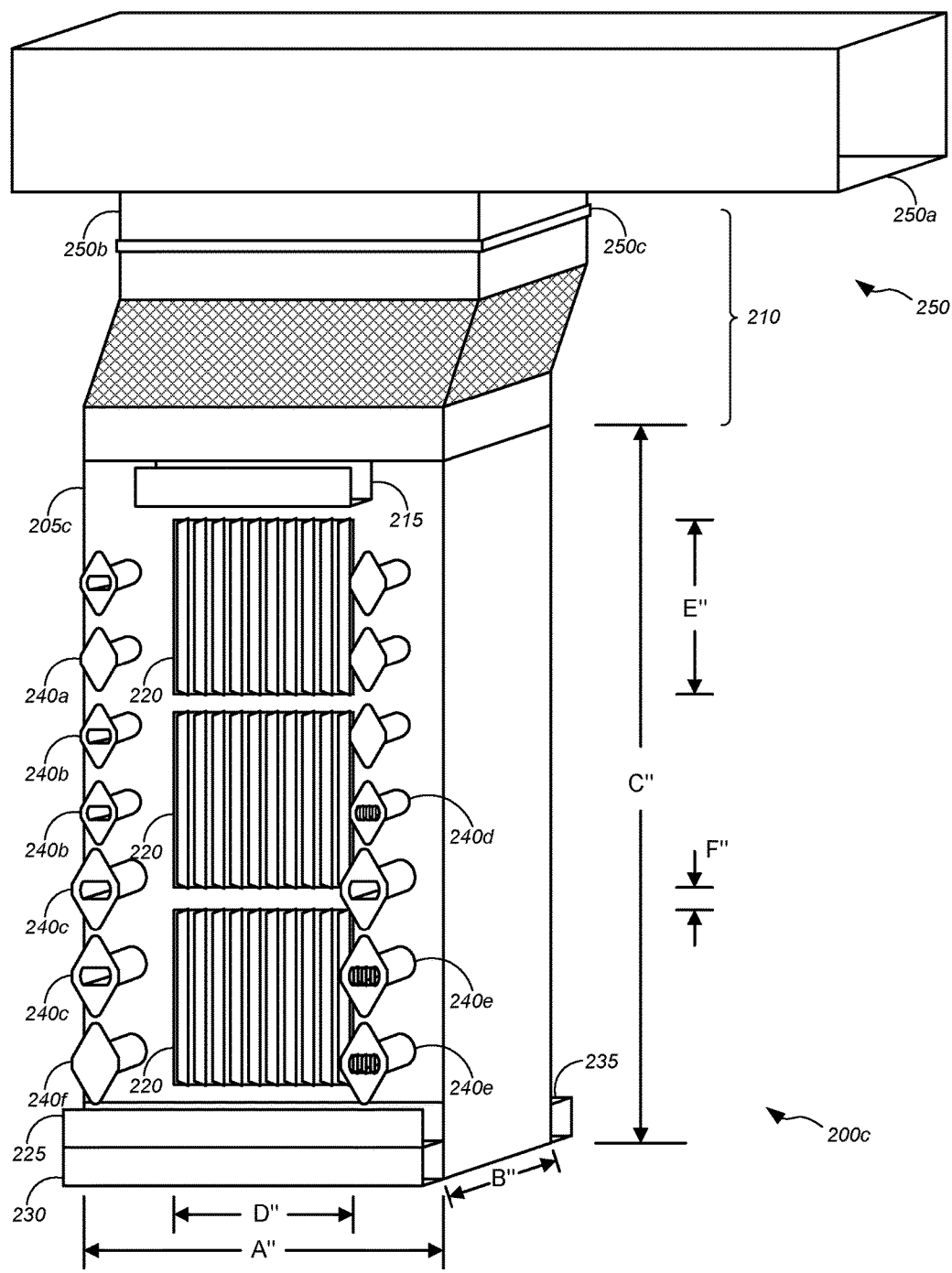

FIGS. 2A-2C (collectively, "FIG. 2") are general schematic diagrams illustrating various air distribution units 200 coupled to corresponding HVAC systems 250, in accordance with various embodiments. FIG. 2A illustrates a perspective view of an embodiment of a SADU 200a coupled to HVAC system 250, while FIG. 2B illustrates a perspective view of an embodiment of a DADU 200b coupled to HVAC system 250, and FIG. 2C illustrates a perspective view of an embodiment of a MADU 200c coupled to HVAC system 250.

With reference to FIGS. 2A-2C, each of the SADU, DADU, and MADU (collectively, "air distribution units 200) might comprise flexible connector assembly 210 that couples with HVAC system 250. The flexible connector assembly 210 serves to provide vibration isolation between the overhead ducts of the HVAC system and the air distribution unit 200. The flexible connector assembly 210 might comprise connector portions 210a, 210c and a flexible portion 210b. One of the connector portions 210a (hereinafter "upper connector portion 210a") is configured to couple the flexible connector assembly 210 to the top portion/opening of the enclosure 205 of each air distribution unit 200, while another of the connector portions 210c (hereinafter "lower connector portion 210c") is configured to couple to a duct termination point 250b extending downward from an air conduit 250a of the HVAC system 250. In some cases, a connector 250c might be used to facilitate coupling of the upper connector portion 210a and the duct termination point 250b. The connector 250c can be any suitable connector including, without limitation, pipe connectors, pipe fittings, duct connectors, duct fittings, flanges, and/or the like. The flexible portion 210b of the flexible connector assembly 210 might be made of any suitable material (including rubber, plastic, and/or the like) that allows for flexible yet resilient/durable connection between the air distribution unit 200 and the duct termination point of the HVAC system 250, while isolating any vibration between the air distribution unit 200 and the duct termination point or ducts/conduits of the HVAC system (as shown in FIG. 2).

Although the conduit, duct, or ductwork 250a, the duct termination point 250b, and the connector 250c are shown in FIG. 2 as being rectangular in shape, profile, or cross-section, the various embodiments are not so limited, and the conduit, duct, or ductwork 250a, the duct termination point 250b, and the connector 250c can each be circular or oval in shape, profile, or cross-section; in such a case, the upper connector portion 210a of the flexible connector assembly 210 might also be of similar shape, while the shape of the lower connector portion 210c might match the shape, profile, or cross-section of the air distribution unit 200 (which as shown in FIG. 2 is rectangular). In some embodiments, an upper opening of the enclosure 205 might have a shape, profile, or cross-section different from the shape, profile, or cross-section of the body of the enclosure 205. For example, the body of the enclosure might have a rectangular shape, profile, or cross-section, while the upper opening might have a circular or oval shape, profile, or cross-section to match a circular or oval lower connector portion 210c of a flexible connector assembly 210; in such a case, the entire flexible connector assembly 210 might have a circular or oval shape, profile, or cross-section.

In the embodiment shown in FIG. 2A, SADU 200a comprises enclosure 205a, flexible connector assembly 210, upper cable trough 215, one or more air vents 220, lower cable trough 225, front guard rail cover 230, and rear guard rail cover 235. Although not shown, SADU 200a might, in some instances, further include one or more rear cover plates 245.

As shown in FIG. 2A, SADU 200a has a width A, a depth B, and a height C. The one or more air vents 220 each have a width D and a height E, and the adjacent air vents 220 are separated in the height direction by separation distance F. In some embodiments, width A might be any suitable width ranging from 15 inches (~32 cm) to 48 inches (~122 cm), while depth B might be any suitable depth ranging from 12 inches (~30.5 cm) to 48 inches (~122 cm), and height C might be any suitable height ranging from 7 feet (~213 cm) to 11.5 feet (~351 cm). According to some embodiments, width D of each air vent 220 might be any suitable width ranging from 8 inches (~20 cm) to 30 inches (~76 cm; e.g., in a 48 inch or ~122 cm wide unit), while height E of each air vent 220 might be any suitable height ranging from 20 inches (~51 cm) to 36 inches (~91 cm; e.g., in an 11.5 ft or ~351 cm tall unit), and spacing F of the air vents 220 might be any suitable spacing ranging from 0 inches (0 cm) to 8 inches (~20 cm). In one embodiment, SADU 200a might have a width A of about 20 inches (~51 cm), a depth B of about 23 inches (~58 cm), and height C of about 7 feet (~213 cm), and the air vents 220 might have a width D of about 12 inches (~30.5 cm), a height E of about 24 inches (~61 cm), and a height spacing F between the adjacent air vents 220 of about 2 inches (~5 cm).

In the embodiment shown in FIG. 2B, DADU 200b comprises enclosure 205b, flexible connector assembly 210, upper cable trough 215, one or more air vents 220, lower cable trough 225, front guard rail cover 230, and rear guard rail cover 235. Although not shown, DADU 200b might, in some instances, further include one or more rear cover plates 245.

As shown in FIG. 2B, DADU 200b has a width A', a depth B', and a height C'. The one or more air vents 220 each have a width D' and a height E', and the adjacent air vents 220 are separated in the height direction by separation distance F'. In some embodiments, width A' might be any suitable width ranging from 15 inches (~32 cm) to 48 inches (~122 cm), while depth B' might be any suitable depth ranging from 12 inches (~30.5 cm) to 48 inches (~122 cm), and height C' might be any suitable height ranging from 7 feet (~213 cm) to 11.5 feet (~351 cm). According to some embodiments, width D' of each air vent 220 might be any suitable width ranging from 8 inches (~20 cm) to 30 inches (~76 cm; e.g., in a 48 inch or ~122 cm wide unit), while height E' of each air vent 220 might be any suitable height ranging from 20 inches (~51 cm) to 36 inches (~91 cm), and spacing F' of the air vents 220 might be any suitable spacing ranging from 0 inches (0 cm) to 8 inches (~20 cm). In one embodiment, DADU 200b might have a width A' of about 20 inches (~51 cm), a depth B' of about 23 inches (~58 cm), and height C' of about 7 feet (~213 cm), and the air vents 220 might have a width D' of about 12 inches (~30.5 cm), a height E' of about 24 inches (~61 cm), and a height spacing F' between the adjacent air vents 220 of about 2 inches (~5 cm).

The DADU 200b might further comprise a plurality of dowels 240a, which, like dowels 140a and 140f described above with respect to FIG. 1, are configured to store fiber slack from one or more cables (including, without limitation, optical fiber cables, copper cables, twisted wire data cables, and/or the like) from at least one of the one or more heat generating equipment, by wrapping the fiber slack from the one or more cables around at least a portion of the shaft of at least one dowel of the plurality of dowels. In DADU 200b, the plurality of dowels 240a do not comprise air passages for directing air through the dowels, unlike dowels 140b-140e described with respect to FIG. 1. As shown in FIG. 2B, the dowels have a generally cylindrical shaped shaft with a diamond shaped end plate. In alternative embodiments, rather than the circular profile or cross-section (i.e., of the cylindrical shaft), the shaft might have an oval profile or cross-section (i.e., having a three dimensional shape of an oval prism or the like). In some instances, rather than the diamond shaped end plate (as shown in FIG. 2B), a circular, square, or rectangular end plate might be used. In some cases, corners of the dowel end plates (such as, but not limited to, the diamond shaped, square, or rectangular dowel end plates) may be rounded to prevent injury to workers and/or damage to cables (especially fragile optical cables), and/or the like.

In the embodiment shown in FIG. 2C, MADU 200c comprises enclosure 205c, flexible connector assembly 210, upper cable trough 215, one or more air vents 220, lower cable trough 225, front guard rail cover 230, and rear guard rail cover 235. Although not shown, MADU 200c might, in some instances, further include one or more rear cover plates 245.

As shown in FIG. 2C, MADU 200c has a width A", a depth B", and a height C". The one or more air vents 220 each have a width D" and a height E", and the adjacent air vents 220 are separated in the height direction by separation distance F". In some embodiments, width A" might be any suitable width ranging from 15 inches (~32 cm) to 48 inches (~122 cm), while depth B" might be any suitable depth ranging from 12 inches (~30.5 cm) to 48 inches (~122 cm), and height C" might be any suitable height ranging from 7 feet (~213 cm) to 11.5 feet (~351 cm). According to some embodiments, width D" of each air vent 220 might be any suitable width ranging from 4 inches (~10 cm) to 12 inches (~30.5 cm), while height E" of each air vent 220 might be any suitable height ranging from 12 inches (~30.5 cm) to 24 inches (~61 cm), and spacing F" of the air vents 220 might be any suitable spacing ranging from 0 inches (0 cm) to 8 inches (~20 cm). In one embodiment, MADU 200c might have a width A" of about 20 inches (~51 cm), a depth B" of about 23 inches (~58 cm), and height C" of about 7 feet (~213 cm), and the air vents 220 might have a width D" of about 12 inches (~30.5 cm), a height E" of about 24 inches (~61 cm), and a height spacing F" between the adjacent air vents 220 of about 2 inches (~5 cm).

The MADU 200c might further comprise a plurality of dowels 240, which might include any combination of one or more basic dowels 240a, one or more air distributing dowels 240b, one or more enlarged air distributing dowels 240c, one or more louvered vent dowels 240d, one or more enlarged louvered vent dowels 240e, and/or one or more enlarged basic dowels 240f, and/or the like. The one or more air distributing dowels 240b and the one or more enlarged air distributing dowels 240c might each comprise an air passage through the shaft and through the dowel end plate, and the air passage directs air from the HVAC system through the enclosure 205 of the air distribution unit 200 to a position in front of the at least one air distribution unit 200c. The one or more louvered vent dowels 240d and the one or more enlarged louvered vent dowels 204e might each comprise a dowel end plate having a louvered vent opening configured to direct air from the HVAC system through the enclosure 205 of the air distribution unit 200c through the shaft of the dowel to a position in front of the at least one air distribution unit 200c and/or to a position in front of the one or more heat generating equipment. All dowels 240 are configured to store fiber slack from one or more cables (including, without limitation, optical fiber cables, copper cables, twisted wire data cables, and/or the like) from at least one of the one or more heat generating equipment, by wrapping the fiber slack from the one or more cables around at least a portion of the shaft of at least one dowel of the plurality of dowels.

As shown in FIG. 2C, the dowels have a generally cylindrical shaped shaft with a diamond shaped end plate. In alternative embodiments, rather than the circular profile or cross-section (i.e., of the cylindrical shaft), the shaft might have an oval profile or cross-section (i.e., having a three dimensional shape of an oval prism or the like). In some instances, rather than the diamond shaped end plate (as shown in FIG. 2C), a circular, square, or rectangular end plate might be used. In some cases, corners of the dowel end plates (such as, but not limited to, the diamond shaped, square, or rectangular dowel end plates) may be rounded to prevent injury to workers and/or damage to cables (especially fragile optical cables), and/or the like.

Although the various components are shown, in their particular configurations in FIGS. 2A-2C, the embodiments are not so limited, and different configurations of the various components may be implemented, so long as the functionality of each component (as described above) can be achieved. For example, the one or more vents 220, rather than comprising louvered directional vent registers as shown in the FIG. 2, can comprise non-louvered vent registers, non-adjustable louvered directional vent registers, adjustable louvered directional vent registers, and/or motorized adjustable louvered directional vent registers, as appropriate.

Further, for louvered directional vent registers (whether non-adjustable, adjustable, or motorized adjustable), the vent registers (or vanes thereof) may be pointed in one direction or in multiple directions. For example, as shown in FIGS. 2A and 2C, all of the vanes of all vent registers or air vents 220 may be pointed to the right of the air distribution unit (when facing the front of the air distribution unit 200). While all of the vanes of the upper vent register or upper air vent 220 of DADU 200b in FIG. 2B are pointed to the right, half of the vanes of the middle and lower vent registers or air vents 220 of DADU 200b in FIG. 2B may be pointed to the right while the other half may be pointed to the left. In this manner, much of the air might be focused or directed to equipment to the right of the DADU 200b, while some of the air might be focused or directed to equipment to the left of the DADU 200b (when facing the front of the DADU 200b). Any combination of directions of each vane of the vent register or air vent 220 may be implemented at any one time. For instance, each vane might be pointed at an angle different from an adjacent vane. In this manner, a generally radially outward flow of air (from the front of the air distribution unit 200) may be achieved. In some cases, two or more vanes might form a first group, with each vane in the first group being parallel with each other, while vanes of a second (or third, etc.) group might be pointed at different directions from the vanes of the first group, and so on. Although the figures show air vents having vanes pointed in the left and/or right directions, the air vents 220 might include vanes that additionally point in the upward direction, downward direction, and/or direction parallel with the floor. This vertical and horizontal positioning of the vanes allows for directing or focusing air in both the vertical and lateral planes, and can be used to channel the (cool) air to a position directly in front of an air intake device of the heat generating equipment to be cooled, rather than simply to a position above, in front of, and below the air intake device (as with vanes that direct air to the left or right of the air distribution unit).

In some embodiments, the cable troughs 215 and 225 can be of different heights, widths, and depths as compared with the examples shown, and the guard rail covers 230 and 235 can be configured to have different dimensions and shapes while covering anchor points (not shown) that anchor the air distribution unit 200 to the floor of the facility. Further, in some instances, not all of these components shown in FIG. 2 may be utilized. For example, each of the SADU, DADU, and MADU might omit one or more of upper cable trough 215, lower cable trough 225, front guard rail cover 230, rear guard rail cover 235, and/or one or more rear cover plates 245. Any guard rail covers 230 or 235 might be configured to mimic the standard network frame base guardrail configuration. In some embodiments, each of the SADU, DADU, and MADU might also omit the flexible connector assembly 210, in which case, each of the SADU, DADU, and MADU might connect directly with a duct termination point or duct connection point of an HVAC system, without any vibration isolation component therebetween.

For each of the SADU, DADU, and MADU shown in FIG. 2 (which are passive air distribution units), no top support, line-up grounding, or base alternating current ("AC") outlets are required. For active air distribution versions of the SADU, DADU, and/or MADU of FIG. 2, grounding and AC outlets may be beneficial, although grounding and power may be connected, e.g., by electrically coupling to adjacent equipment (e.g., heat generating equipment) and/or to grounding and AC outlets for such adjacent equipment. Each air distribution unit 200 may be made of any suitable material including, but not limited to, steel (such as 14 gauge steel), and/or the like.

Figure 3A:
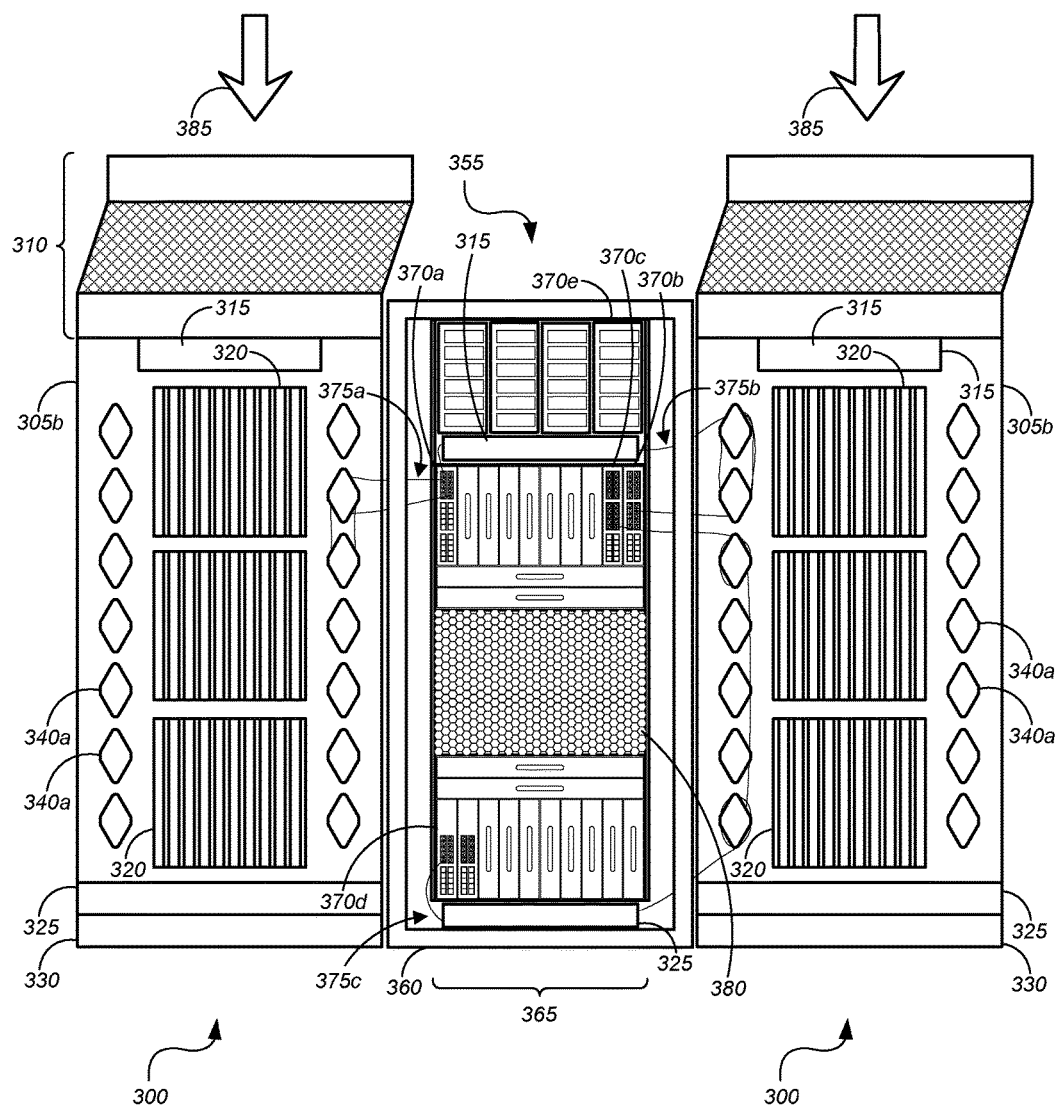
FIGS. 3A-3B are general schematic diagrams illustrating a pair of Dual-Function Air Distribution Units ("DADUs") in positional relationship with equipment to be cooled, and illustrating air flow through the DADUs to the equipment, in accordance with various embodiments.
Figure 3B:
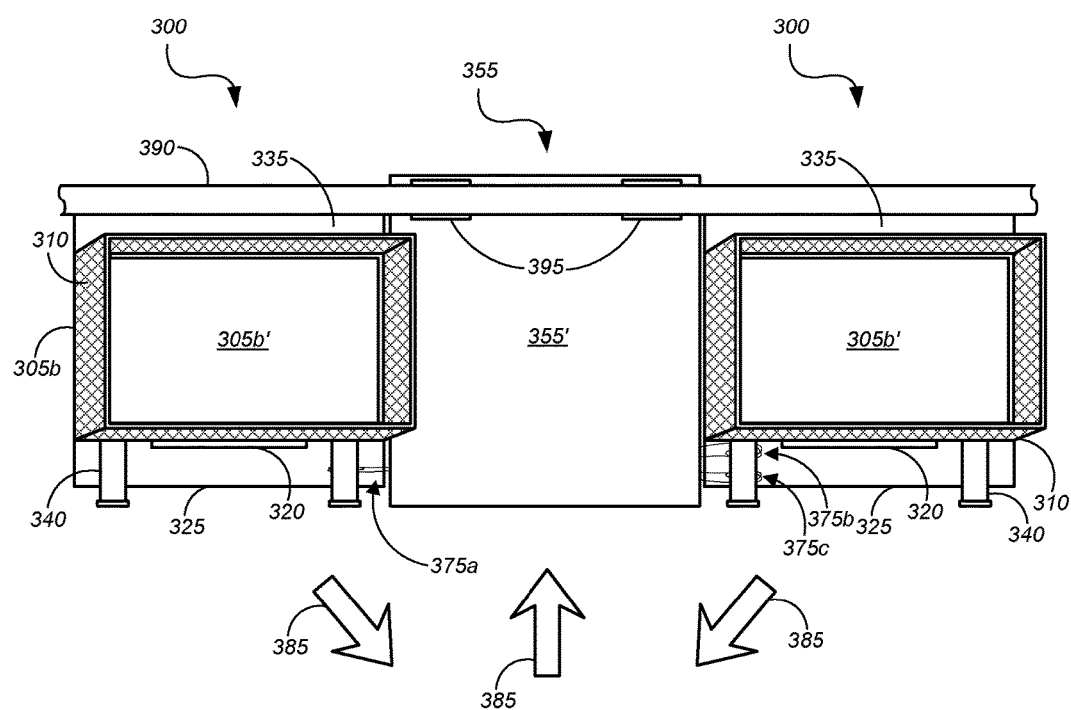
Figure 4:
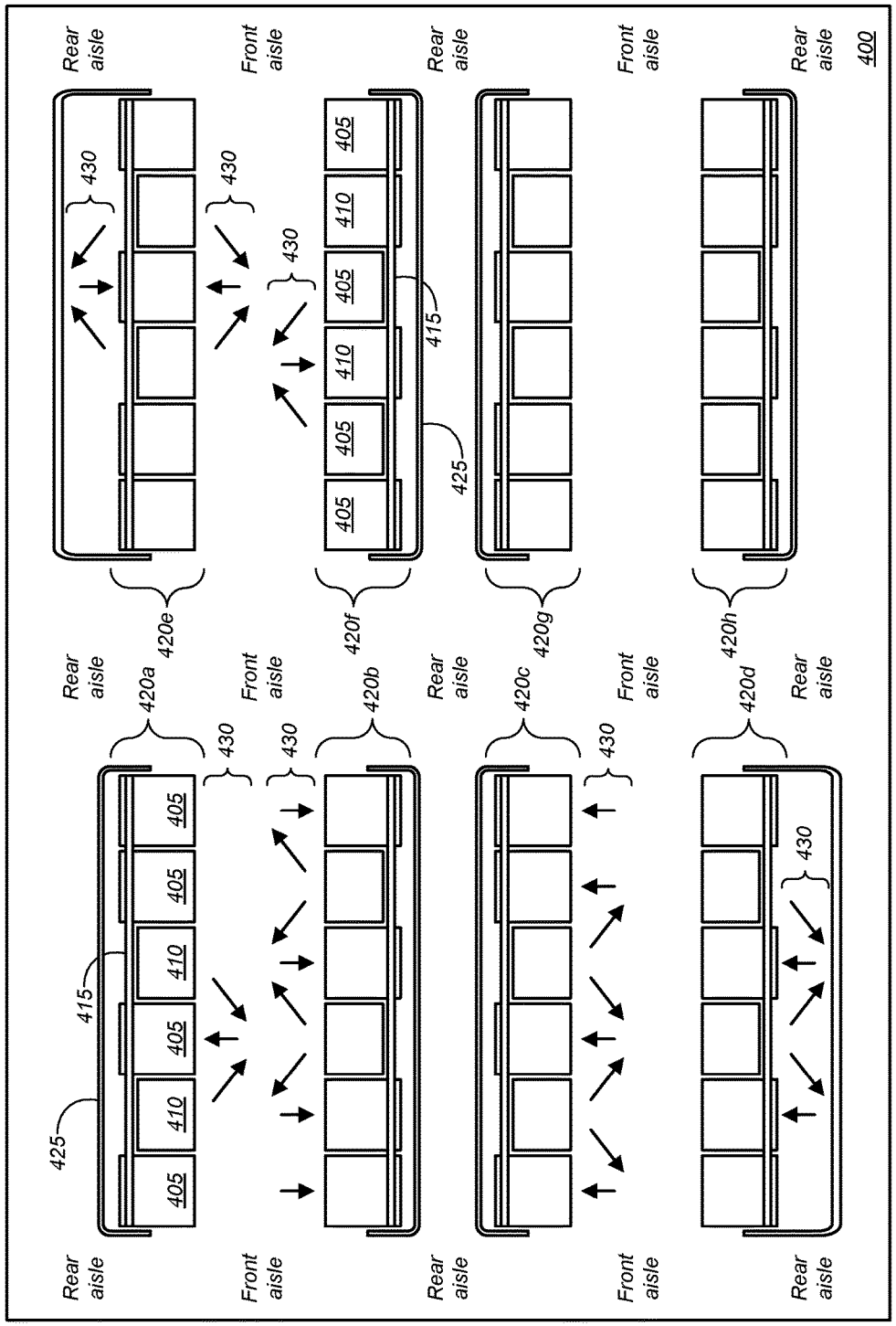
FIG. 4 is a general schematic diagram illustrating an example of a telecommunications facility having air distribution units positioned in line within rows of telecommunications equipment racks, in accordance with various embodiments.

We now turn to FIGS. 3A and 3B (collectively, "FIG. 3"), which are general schematic diagrams illustrating a pair of Dual-Function Air Distribution Units ("DADUs") 300 in positional relationship with equipment 355 to be cooled, and illustrating air flow through the DADUs 300 to the equipment 355, in accordance with various embodiments. In FIG. 3, each of the DADUs 300 might be similar, if not identical, to the DADU 200 as shown and described above with respect to FIGS. 1A and 2B. For example, each DADU 300 might comprise enclosure 305b, flexible connector assembly 310, upper cable trough 315, one or more air vents 320, lower cable trough 325, front guard rail cover 330, rear guard rail cover 335, and/or a plurality of dowels 340a, which might respectively correspond to enclosure 105b, flexible connector assembly 110, upper cable trough 115, one or more air vents 120, lower cable trough 125, front guard rail cover 130, rear guard rail cover 135, and/or a plurality of dowels 140a of FIG. 1, and/or might respectively correspond to enclosure 205b, flexible connector assembly 210, upper cable trough 215, one or more air vents 220, lower cable trough 225, front guard rail cover 230, rear guard rail cover 235, and/or a plurality of dowels 240a of FIG. 2. In some instances, DADU 300 might further comprise one or more dowels 340f (not shown) corresponding to dowels 140f or 240f, and/or one or more rear cover plates 345 (not shown) corresponding to rear cover plates 145 or 245.

Equipment 355 might include, but is not limited to, a blade server system, a rack server system, a data storage system, network systems, telecommunications systems, server management systems, and/or any combination thereof. Equipment 355 includes a chassis (or rack) 360 and electronic components 365. The electronic components 365 might include any combination of blade servers (including half-height and full-height blade servers, and/or the like), rack servers, data storage devices, network devices, telecommunications devices, server management devices, and/or the like. In the non-limiting example of FIG. 3A, equipment 355 includes telecommunications devices 370a-370d and data storage devices 370e. In some instances, equipment 355 and/or chassis 360 might further include an upper cable trough 315 and/or a lower cable trough 325, which might be similar, if not identical to, upper cable trough 315 and lower cable trough 325 of the DADU 300.

In some embodiments, cables 375 might connect one or more cable ports on one or more electronic components 365 of equipment 355 to cable ports on electronic components (including electronic component 365 of equipment 355 and/or electronic components 365 of other equipment (not shown)). Any cable slack might be stored in or on any of upper cable trough 315, lower cable trough 325, and/or one or more of the plurality of dowels 340 of adjacent DADUs 300. Cables 375 can include, without limitation, optical fiber cables, copper cables, twisted wire data cables, and/or the like. In the non-limiting example of FIG. 3A, optical fiber cables 375a, 375b, and 375c connect ports on one telecommunication device 370a-370d with another port on the same device 370a-370d, or connect a port on one device 370a-d with a port on another device 370a-370d. For example, optical fiber cable 375a connects a first port on a first telecommunications device 370a with a second port on the same device 370a, while optical fiber cable 375b connects a third port on the first telecommunications device 370a with a first port on a second telecommunications device 370b. Meanwhile, optical fiber cable 375c connects a first port on a third telecommunications device 370c with a first port on a fourth telecommunications device 370d. As shown in FIG. 3A, the slack from optical fiber 375a is stored in dowels 340a of one of the DADUs 300, while the slack in optical fiber 375b is stored in both the upper cable trough 315 and dowels 340a of the other DADU 300. The slack in optical fiber 375c is stored in both dowels 340a of the other DADU 300 and the lower cable trough 325.

Equipment 355 further comprises a cooling device, which might be in communication with an air intake device 380 (which is represented in FIG. 3A by a honey-comb structure on the front panel of equipment 355).

In operation, air from the facility's HVAC system is received by the flexible connector assembly of each DADU 300, via (ceiling mounted) conduits and duct termination points of the HVAC system. The received air is distributed through enclosure 305b and through the air vents (in the case of FIG. 3A, the louvered directional vent registers 320) of each DADU 300, which direct the cool air (at about floor level) to a position in front of equipment 355. The cool air is then received (or drawn in) by the air intake device 380, and distributed through chassis 360 to cool the heat-generating electronics components 365 mounted in chassis 360. The air flow is represented by arrows 385, which show the air flow down toward the enclosure 305b of the DADU 300, out the air vents 120, in front of equipment 355, and toward the air intake device 380. FIG. 3B also shows the interior 305b' of enclosure 305b and the top surface 355' of equipment 355 (in some cases, the top surface of chassis 360).

With reference to FIG. 3B, support bar or frame support 390 is shown supporting equipment 355 via upper anchoring points 395 on the telecommunications equipment 355 (or rack or chassis 360). When equipment 355 is arranged in-line with other equipment in the facility (e.g., as shown in FIG. 4), the support bar or frame support 390 connect the multiple pieces of equipment or the corresponding chassis that are in-line with each other for mutual support. Although not secured by the support bar or frame support 390, each DADU 300 is secured in place (to the floor of the facility) via anchor points at the base thereof, which are covered by front guard rail cover 330 and rear guard rail cover 335.

Although FIG. 3 shows a pair of DADUs 300 being implemented to cool heat generating equipment 355, any combination of SADUs, DADUs, and MADUs as shown and described above with respect to FIGS. 1 and 2 may be implemented, as appropriate or as desired.

FIG. 4 is a general schematic diagram illustrating an example of a telecommunications facility 400 having air distribution units 410 positioned in line within rows 420 of telecommunications equipment racks 405, in accordance with various embodiments. In the example of FIG. 4, a plurality of telecommunications equipment racks 405 are positioned in line with each other in one of a plurality of rows 420a-420h (collectively, "rows 420"). In some instances, a pair of air distribution units 410 might sandwich one of the plurality of telecommunications equipment racks 405. A support bar 415 affixed to the tops of each telecommunications equipment in a row 420 supports and secures the plurality of telecommunications equipment in that row to each other. According to some embodiments, a heat curtain 425 might be implemented to surround a rear portion of the telecommunications equipment in the row 420 to reduce the amount of heat that is generated by the telecommunications equipment mounted in the telecommunications equipment racks 405 in the row 420 (and in some cases expelled by the cooling device of each of the telecommunications racks 405) from spreading to other locations in the facility 400, such as spreading to other rows 420 of telecommunications equipment racks 405 and/or to the electronics equipment mounted on the racks 405.

In operation, each air distribution unit 410—which might include one of a SADU, DADU, or MADU, as described in detail above with respect to FIGS. 1-3—receives (cool) air from a vent supply of a HVAC system (as shown, e.g., in FIG. 2) of the facility 400, and distributes the (cool) air to one or both of the front aisle or rear aisle, which are defined by the rows 420 of the telecommunications rack 405. Herein, a front aisle might be defined by a space separating two rows 420 of the telecommunications racks 405 (and equipment mounted thereon) and across which the front surfaces of one row 420 (e.g., row 420a) of telecommunications racks 405 face the front surfaces of an opposite row 420 (e.g., row 420b) of telecommunications racks 405, and vice versa. In some cases, a front aisle might be defined by a space adjacent to the front surface of a row 420 of telecommunications racks 405 (or the equipment mounted thereon). In such cases, the space might be of sufficient width to allow a person to comfortably walk by the front of the telecommunications rack 405 (i.e., to walk by the rack, in a normal manner, without having to contort himself or herself).

Similarly, a rear aisle might be defined by a space separating two rows 420 of the telecommunications racks 405 (and equipment mounted thereon) and across which the rear surfaces of one row 420 (e.g., row 420b) of telecommunications racks 405 face the rear surfaces of the opposite row 420 (e.g., row 420c) of telecommunications racks 405, and vice versa. In some cases, the rear aisle might alternatively or additionally be defined by a space separating two rows 420 of the telecommunications racks 405 (and equipment mounted thereon) and across which a heat curtain 425 (e.g., row 420b) for one row 420 faces a heat curtain 425 for the opposite row 420 (e.g., row 420c), and vice versa. In some instances, a rear aisle might be defined by a space adjacent to the rear surface of a row 420 of telecommunications racks 405 (or the equipment mounted thereon) and/or adjacent to an outer surface of a heat curtain 425 (the inner surface of the heat curtain 425 facing the rear surface of the telecommunications racks 405 or the equipment mounted thereon). In such cases, the space might be of sufficient width to allow a person to comfortably walk by the rear of the telecommunications rack 405 or heat curtain 425 (i.e., to walk by the rack or curtain, in a normal manner, without having to contort himself or herself).

In some embodiments, the front aisles might have 4 foot (~122 cm) widths/spacings (e.g., from the front of one row 420a to the front of the opposite row 420b), while the rear aisles might have 3 foot (~91 cm) widths/spacings (e.g., from the rear of one row 420b to the rear of another row 420c). In some examples, spacings different from the 4 foot (~122 cm) front widths/spacings and 3 foot (~91 cm) rear widths/spacings may be implemented.

Some of the air flows in the aisles (from the HVAC system through the air distribution units 410) are represented in FIG. 4 by arrows 430. In FIG. 4, not all of the air flows in the aisles are denoted. In some instances, a pair of air distribution units 410 might both focus, direct, or distribute air to one telecommunications rack 405 (as shown, e.g., with respect to rows 420a and 420f). In some cases, each air distribution unit 410 in one row might focus, direct, or distribute air to telecommunications racks 405 on either side of the air distribution unit 410 (as shown, e.g., with respect to rows 420b and 420c). In some embodiments, an air distribution unit (or a pair of air distribution units) 410 might focus, direct, or distribute air to both a position in front of and a position behind one or more telecommunications racks 405 (as shown, e.g., with respect to rows 420d and 420e).

With reference to FIG. 4, air distribution units 410 typically do not start or finish a lineup of equipment in a row 420 (i.e., are not at either end of a row) because the air distribution units 410 cannot directly support the weight of the overhead ironwork or cable racking. In some cases, stanchions may be required. In some instances, the front base of the air distribution units 410 might align with adjacent equipment racks or cabinets 405 (as shown in FIG. 4). In other cases, the dowel end plates might align with the adjacent equipment racks or cabinets 405, while the base of the air distribution units 410 might be recessed with respect to the adjacent equipment racks or cabinets 405 (e.g., as shown in FIG. 3B). According to some embodiments, and as shown in FIG. 4, air distribution units 410 might be positioned such that no two units 410 face each other across an aisle. In all cases, the space above each air distribution unit 410 must be clear of all obstructions, except for any duct termination points of the HVAC system (and the flexible connector assembly that couples the air distribution unit 410 to the corresponding duct termination point, as shown in FIG. 2).

Figure 5:
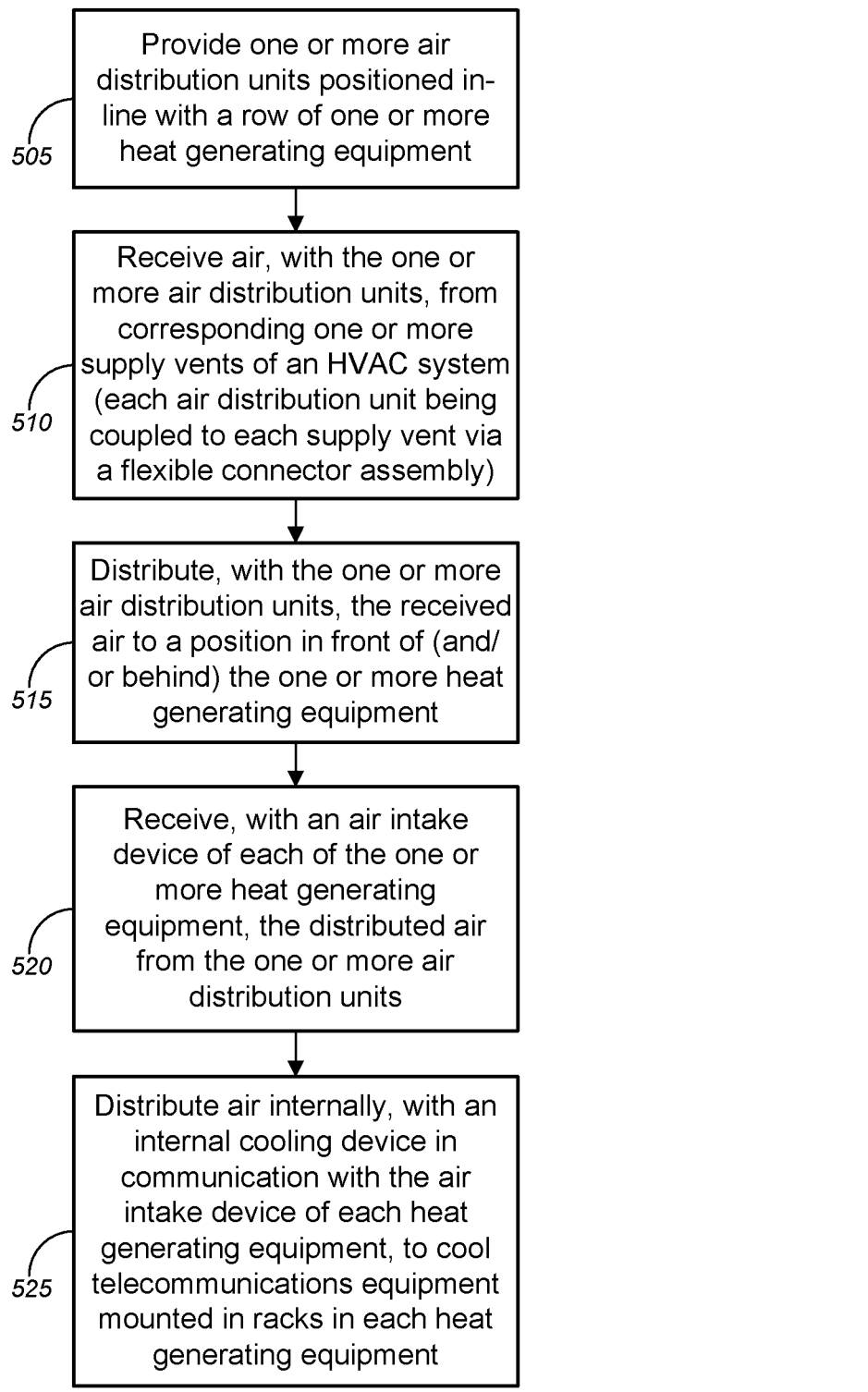
FIG. 5 is a flow diagram illustrating a method for implementing air distribution units for cooling heat generating equipment, in accordance with various embodiments.

With reference to FIG. 5, a method 500 is illustrated for implementing air distribution units for cooling heat generating equipment, in accordance with various embodiments. In FIG. 5, method 500 might comprise, at block 505, providing one or more air distribution units (e.g., any combination of SADUs, DADUs, and/or MADUs described above with respect to FIGS. 1-4) positioned in-line within a row of one or more heat generating equipment (including, without limitation, telecommunications equipment, data/cyber center equipment, data storage equipment, network center equipment, and/or the like). At block 510, method 500 might comprise receiving air, with the one or more air distribution units, from corresponding one or more duct termination points (e.g., as shown in FIG. 2) of an HVAC system for the facility. Each air distribution unit might be coupled to each duct termination point via a flexible connector assembly (such as flexible connector assembly 110, 210, or 310 as shown in FIGS. 1-3, respectively).

Method 500, at block 515, might comprise distributing, with the one or more air distribution units, the received air to a position in front of (and/or behind) the one or more heat generating equipment. Method 500 might further comprise receiving, with an air intake device of each of the one or more heat generating equipment (or cabinets/racks thereof), the distributed air from the one or more air distribution units (block 520). At block 525, method 500 might comprise distributing air internally, with an internal cooling device in communication with the air intake device of each heat generating equipment, to cool telecommunications equipment mounted in racks (or cabinets) in each of the heat generating equipment.

Although FIGS. 4 and 5 are specifically described as using air distribution units to cool or distribute air to telecommunications equipment racks or cabinets, the various air distribution units may be used to cool or distribute air to any cabinets, racks, and/or chassis for any type of heat generating equipment, including, but not limited to, equipment for telecommunication central offices ("COs"), data/cyber centers, data storage center, network center, server centers, and/or the like.

While certain features and aspects have been described with respect to exemplary embodiments, one skilled in the art will recognize that numerous modifications are possible. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture, but instead can be implemented on any suitable hardware, firmware, and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without—certain features for ease of description and to illustrate exemplary aspects of those embodiments, the various components and/or features described herein with respect to a particular embodiment can be substituted, added, and/or subtracted from among other described embodiments, unless the context dictates otherwise. Consequently, although several exemplary embodiments are described above, it will be appreciated that the invention is intended to cover all modifications and equivalents within the scope of the following claims.

What is claimed is:

1. A method, comprising:
receiving air, with an air distribution unit comprising a first front surface that is positioned in-line with one or more heat generating equipment comprising a second front surface corresponding to each of the one or more heat generating equipment, from a heating, ventilation, and air conditioning ("HVAC") system, wherein the first front surface of the air distribution unit is positioned in-line with the second front surface corresponding to each of the one or more heat generating equipment;
distributing, with the air distribution unit, the received air to a first position in front of the second front surface corresponding to each of the one or more heat generating equipment for intake by a first air intake device of at least one of the one or more heat generating equipment; and
distributing, with the air distribution unit, the received air to a second position located on an opposite side of the second front surface of the one or more heat generating equipment for intake by a second air intake device located on a rear surface of the at least one of the one or more heat generating equipment.

2. The method of claim 1, wherein the air distribution unit is a passive air distribution unit.

3. The method of claim 1, wherein the HVAC system is configured to provide heating, ventilation, and air conditioning to at least a portion of a building in which the one or more heat generating equipment is located.

4. The method of claim 1, wherein distributing, with the air distribution unit, the received air to the position in front of the one or more heat generating equipment comprises distributing, with the air distribution unit, the received air at a rate of at least 500 cubic feet per minute ("CFM") to the position in front of the one or more heat generating equipment.

5. The method of claim 1, wherein each of at least one of the one or more heat generating equipment comprises:
one or more telecommunications equipment;
a telecommunications rack containing the one or more telecommunications equipment; and
a rack cooling device in communication with the first air intake device, the rack cooling device configured to distribute air within the telecommunications rack to cool the one or more telecommunications equipment.

6. An air distribution unit, comprising:
an enclosure comprising a first front surface positioned in-line with one or more heat generating equipment comprising a second front surface corresponding to each of the one or more heat generating equipment, wherein the first front surface of the enclosure is positioned in-line with the second front surface corresponding to each of the one or more heat generating equipment;
an air supply portion configured to receive air from a duct termination point of a heating, ventilation, and air conditioning ("HVAC") system;
a plurality of first air vents configured to distribute the received air to a first position in front of the second front surface corresponding to each of the one or more heat generating equipment for intake by an air intake device of each of the one or more heat generating equipment; and
a plurality of second air vents configured to distribute the received air to a second position located on an opposite side of the second front surface of the one or more heat generating equipment for intake by a second air intake device located on a rear surface of the at least one of the one or more heat generating equipment.

7. The air distribution unit of claim 6, further comprising:
a flexible connector assembly configured to provide flexible connection between the air supply portion and the duct termination point of the HVAC system.

8. The air distribution unit of claim 6, wherein each of the plurality of air vents comprises an adjustable louvered directional vent register.

9. The air distribution unit of claim 8, wherein the adjustable louvered directional vent register comprises a motorized adjustable louvered directional vent register.

10. The air distribution unit of claim 6, further comprising:
a plurality of dowels attached to one or more of a front surface or a rear surface of the air distribution unit, each of the plurality of dowels comprising a shaft and a dowel end plate,
wherein the plurality of dowels is configured to store fiber slack from one or more cables from at least one of the one or more heat generating equipment, by wrapping the fiber slack from the one or more cables around at least a portion of the shaft of at least one dowel of the plurality of dowels.

11. The air distribution unit of claim 10, wherein each of one or more dowels of the plurality of dowels comprises an air passage through the shaft and through the dowel end plate, wherein the air passage directs air from the HVAC system through the enclosure of the air distribution unit to a position in front of the air distribution unit.

12. The air distribution unit of claim 11, wherein the dowel end plate of at least one dowel of the one or more dowels comprises a louvered vent opening configured to direct air from the HVAC system through the enclosure of the air distribution unit through the shaft of the at least one dowel to the position in front of the one or more heat generating equipment.

13. The air distribution unit of claim 6, further comprising:
one or more cable troughs affixed to one or more of a front surface or a rear surface of the air distribution unit, the one or more cable troughs configured to enable cable routing across the air distribution unit;
a plurality of anchor points configured to enable floor mounting of the air distribution unit; and
a plurality of guard rail covers configured to cover the plurality of anchor points.

14. A system, comprising:
one or more heat generating equipment arranged inline within a row in a room, each of the one or more heat generating equipment comprising:

a first front surface; and
an air intake device; and
a heating, ventilation, and air conditioning ("HVAC") system for supplying one or more of heating, ventilation, or air conditioning to the room, the HVAC system comprising:
a plurality of duct termination points;
one or more air distribution units, each air distribution unit comprising:
an enclosure positioned in-line with the one or more heat generating equipment within the row;
a second front surface, wherein the first front surface corresponding to each of the one or more heat generating equipment is positioned in-line with the second front surface corresponding to each of the one or more air distribution units;
an air supply portion configured to receive air from a first duct termination point of the plurality of duct termination points of the HVAC system;
a plurality of first air vents configured to distribute the received air to a position in front of the first front surface corresponding to each of the one or more heat generating equipment for intake by the air intake device of each of the one or more heat generating equipment; and
a plurality of second air vents configured to distribute the received air to a second position located on an opposite side of the second front surface of the one or more heat generating equipment for intake by a second air intake device located on a rear surface of the at least one of the one or more heat generating equipment.

15. The system of claim 14, wherein at least one of the one or more heat generating equipment further comprises:
one or more telecommunications equipment;
a telecommunications rack containing the one or more telecommunications equipment; and
a rack cooling device in communication with the air intake device, the rack cooling device configured to distribute air within the telecommunications rack to cool the one or more telecommunications equipment.

16. The system of claim 14, wherein each of the one or more air distribution units further comprises:
a flexible connector assembly configured to provide flexible connection between the air supply portion and the first duct termination point of the HVAC system.

17. The system of claim 14, wherein each of the plurality of air vents of at least one air distribution unit of the one or more air distribution units comprises an adjustable louvered directional vent register.

18. The system of claim 17, wherein the adjustable louvered directional vent register comprises a motorized adjustable louvered directional vent register.

19. The system of claim 14, wherein at least one air distribution unit of the one or more air distribution units further comprises:
a plurality of dowels attached to one or more of a front surface or a rear surface of the at least one air distribution unit, each of the plurality of dowels comprising a shaft and a dowel end plate,
wherein the plurality of dowels are configured to store fiber slack from one or more cables from at least one of the one or more heat generating equipment, by wrapping the fiber slack from the one or more cables around at least a portion of the shaft of at least one dowel of the plurality of dowels.

20. The system of claim 19, wherein each of one or more dowels of the plurality of dowels comprises an air passage through the shaft and through the dowel end plate, wherein the air passage directs air from the HVAC system through the enclosure of the at least one air distribution unit to a position in front of the at least one air distribution unit.

21. The system of claim 20, wherein the dowel end plate of at least one dowel of the one or more dowels comprises a louvered vent opening configured to direct air from the HVAC system through the enclosure of the at least one air distribution unit through the shaft of the at least one dowel to the position in front of the one or more heat generating equipment.

* * * * *